US009709844B2

(12) United States Patent
Yim et al.

(10) Patent No.: US 9,709,844 B2
(45) Date of Patent: Jul. 18, 2017

(54) DISPLAY APPARATUS CAPABLE OF CONTROLLING LIGHT TRANSMITTANCE AND METHOD OF MANUFACTURING THE SAME

(71) Applicants: Sang-Hoon Yim, Yongin (KR); Jong-Hyuk Lee, Yongin (KR); Young-Woo Song, Yongin (KR)

(72) Inventors: Sang-Hoon Yim, Yongin (KR); Jong-Hyuk Lee, Yongin (KR); Young-Woo Song, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 806 days.

(21) Appl. No.: 13/718,055

(22) Filed: Dec. 18, 2012

(65) Prior Publication Data

US 2013/0314647 A1 Nov. 28, 2013

(30) Foreign Application Priority Data

May 25, 2012 (KR) ........................ 10-2012-0056234

(51) Int. Cl.
*G02F 1/1335* (2006.01)
*H01L 25/00* (2006.01)
(Continued)

(52) U.S. Cl.
CPC ........ *G02F 1/133528* (2013.01); *H01L 25/50* (2013.01); *H01L 27/326* (2013.01);
(Continued)

(58) Field of Classification Search
CPC ............. H01L 51/5281; H01L 27/3232; H01L 2251/5323; G02B 5/3083; G02B 5/30
See application file for complete search history.

(56) References Cited

U.S. PATENT DOCUMENTS 7,772,765 B2 * 8/2010 Park .................... H01L 27/3232 313/506
8,058,657 B2 * 11/2011 Lee ..................... H01L 27/1214 257/462

(Continued)

FOREIGN PATENT DOCUMENTS

KR 10-2005-0043174 A 3/2006
KR 10-2006-0097927 A 4/2007

(Continued)

*Primary Examiner* — Paisley L Arendt
*Assistant Examiner* — Agnes Dobrowolski
(74) *Attorney, Agent, or Firm* — Lee & Morse P.C.

(57) ABSTRACT

A display apparatus capable of controlling light transmittance and a method of manufacturing the display apparatus. The display apparatus includes a transparent display device in which a pixel that has a first region comprising an organic emission layer (organic EL), and a second region adjacent to the first region, the second region transmitting external light, a first circular polarizer in an optical path of light emitted from the transparent display device, a second circular polarizer, the transparent display device being between the first and second circular polarizers, and a transmittance adjusting device including a liquid crystal layer for adjusting transmittance of external light, the transmittance adjusting device being between the transparent display device and the second polarizer such that the transparent display device encapsulates the liquid crystal layer, external light passing through the first circular polarizer, the second circular polarizer, and the transmittance adjusting device.

11 Claims, 10 Drawing Sheets

(51) Int. Cl.
*H01L 51/52* (2006.01)
*H01L 27/32* (2006.01)

(52) U.S. Cl.
CPC ...... *H01L 27/3232* (2013.01); *H01L 51/5281* (2013.01); *G02F 2001/133541* (2013.01); *G02F 2201/44* (2013.01); *H01L 2924/0002* (2013.01)

(56) References Cited

U.S. PATENT DOCUMENTS

| | | | | |
|---|---|---|---|---|
| 2007/0109465 | A1 | 5/2007 | Jung et al. | |
| 2008/0018834 | A1* | 1/2008 | Matsushima | G02B 27/286 349/98 |
| 2009/0073369 | A1* | 3/2009 | Hsu | G09G 3/3216 349/143 |
| 2010/0320494 | A1* | 12/2010 | Kim | G02B 5/3033 257/98 |
| 2011/0134018 | A1* | 6/2011 | Seo | H01L 51/003 345/76 |
| 2012/0268696 | A1 | 10/2012 | Yim et al. | |
| 2012/0327331 | A1 | 12/2012 | Yim et al. | |

FOREIGN PATENT DOCUMENTS

| | | | |
|---|---|---|---|
| KR | 10-2007-0046353 | A | 5/2007 |
| KR | 10-0754874 | B1 | 9/2007 |

* cited by examiner

DISPLAY APPARATUS CAPABLE OF CONTROLLING LIGHT TRANSMITTANCE AND METHOD OF MANUFACTURING THE SAME

CROSS-REFERENCE TO RELATED APPLICATIONS

This application claims the benefit under 35 U.S.C. §119 of Korean Patent Application No. 10-2012-0056234, filed on May 25, 2012, in the Korean Intellectual Property Office, the disclosure of which is incorporated herein in its entirety by reference.

BACKGROUND

1. Field

The inventive concept relates to a display apparatus, and more particularly, to a display apparatus capable of changing light transmittance according to modes, and a method of manufacturing the display apparatus.

2. Description of the Related Art

An organic light-emitting display apparatus is widely used in personal portable devices, e.g., a moving picture experts group layer 3 (MP3) player, a mobile phone, or the like, and other display, e.g., televisions, computer monitors, or the like, due to its excellent characteristics with respect to viewing angles, contrast, response times, power consumption, and the like. The organic light-emitting display apparatus has a self-emission characteristic, and thus, does not require a separate light source, unlike a liquid crystal display (LCD) apparatus. Therefore, a thickness and a weight of the organic light-emitting display apparatus may be reduced. Also, the organic light-emitting display apparatus may have a transparent thin-film transistor (TFT) or a transparent organic light-emitting device and may have a transmission region (or a transmittance window) separate from a pixel region, so that the organic light-emitting display apparatus may be formed as a transparent display apparatus.

SUMMARY

According to an aspect of the inventive concept, there is provided a display apparatus capable of controlling light transmittance, the display apparatus including a transparent display device in which a pixel that has a first region including an organic emission layer (organic EML), and a second region, adjacent to the first region, transmitting external light, a first circular polarizer in an optical path of light emitted from the transparent display device, a second circular polarizer, the transparent display device being between the first and second circular polarizers, and a transmittance adjusting device including a liquid crystal layer for adjusting transmittance of external light, the transmittance adjusting device being between the transparent display device and the second polarizer such that the transparent display device encapsulates the liquid crystal layer, external light passing through the first circular polarizer, the second circular polarizer, and the transmittance adjusting device.

The liquid crystal layer may correspond to the second region of the transparent display device, and liquid crystals in a vertical alignment nematic (VAN) mode may be disposed in the liquid crystal layer.

The transparent display device may include a first substrate having a first surface on which the pixel of the transparent display device is formed, and a second substrate facing the first surface, and the transmittance adjusting device may include a third substrate, and the liquid crystal layer between the second surface of the first substrate and the third substrate. Here, the transmittance adjusting device may include a first transparent electrode formed on the second surface of the first substrate; a first alignment layer formed on the first transparent electrode; a second transparent electrode formed on a surface of the third substrate; and a second alignment layer formed on the second transparent electrode. Also, absorption axes of the first polarizer and the second polarizer may be in the same direction, slow axes of the first polarizer and the second polarizer may be in the same direction, and liquid crystals of the liquid crystal layer may be aligned to be perpendicular to surfaces of the first and third substrates while an electric field is not applied thereto, and when an electric field is applied thereto, the liquid crystals may be horizontally aligned in a direction perpendicular to the slow axes. The second substrate may be a thin film encapsulation (TFE) member.

The transparent display device may include a second substrate on which the pixel of the transparent display device is formed, and a first substrate having a first surface that faces the second substrate, and the transmittance adjusting device may include a third substrate, and the liquid crystal layer between a second surface of the first substrate and the third substrate. Here, the transmittance adjusting device may include a first transparent electrode formed on the second surface of the first substrate; a first alignment layer formed on the first transparent electrode; a second transparent electrode formed on a surface of the third substrate; and a second alignment layer formed on the second transparent electrode. Also, absorption axes of the first polarizer and the second polarizer may be in the same direction, slow axes of the first polarizer and the second polarizer may be in the same direction, and liquid crystals of the liquid crystal layer may be aligned to be perpendicular to surfaces of the first and third substrates while an electric field is not applied thereto, and when an electric field is applied thereto, the liquid crystals may be horizontally aligned in a direction perpendicular to the slow axes.

A rotation direction of external light by the first polarizer may be opposite to a rotation direction of external light by the second polarizer.

The first polarizer may include a first linear polarizer that is disposed on an exterior side of the first substrate and that linearly polarizes the external light, and a first retarder that is disposed between the first linear polarizer and the first substrate of the transparent display device and that retards a phase of the external light by a first phase; and the second polarizer may include a second linear polarizer that is disposed on an exterior side of the third substrate and that linearly polarizes the external light, and a second retarder that is disposed between the second linear polarizer and the third substrate and that retards the phase of the external light by a second phase.

Absorption axes of the first linear polarizer and the second linear polarizer may be in the same direction, slow axes of the first retarder and the second retarder may be in the same direction, and liquid crystals of the liquid crystal layer may be aligned to be perpendicular to surfaces of the first and third substrates while an electric field is not applied thereto, and when an electric field is applied thereto, the liquid crystals may be horizontally aligned in a direction perpendicular to the slow axes.

Absolute values of the first phase and the second phase may be equal to each other, and rotation directions of the first phase and the second phase may be different from each other. For example, the first phase may be −¼ wavelength, and the second phase may be +¼ wavelength.

A first substrate and a third substrate may be separated from each other by a distance in which the liquid crystal layer is capable of changing a phase of the external light by 90 degrees.

According to another aspect of the inventive concept, there is provided a method of manufacturing a display apparatus that includes a first region emitting light and a second region adjacent to the first region and transmitting external light and that is capable of controlling light transmittance, the method including forming a thin film transistor (TFT), and a pixel electrode electrically connected to the TFT in the first region of a first substrate, forming a transmittance adjusting device for adjusting transmittance of the external light by encapsulating liquid crystals between a third substrate and a second surface that is opposite to a first surface of the first substrate on which the pixel electrode is formed; forming an organic light-emitting device by sequentially stacking an organic emission layer (organic EML) and an opposite electrode on the pixel electrode; encapsulating the first surface of the first substrate by using a second substrate; and disposing a first polarizer and a second polarizer on exterior sides of the second substrate and the third substrate, respectively, so as to circularly polarize and to transmit the external light.

The operation of forming the transmittance adjusting device may include operations of sequentially forming a first transparent electrode and a first alignment layer on the second surface of the first substrate; sequentially forming a second transparent electrode and a second alignment layer on a surface of the third substrate; and encapsulating the liquid crystals between the first alignment layer and the second alignment layer.

Absorption axes of the first polarizer and the second polarizer may be in the same direction, slow axes of the first polarizer and the second polarizer may be in the same direction, and liquid crystals of the liquid crystal layer may be aligned to be perpendicular to surfaces of the first and third substrates while an electric field is not applied thereto, and when an electric field is applied thereto, the liquid crystals may be horizontally aligned in a direction perpendicular to the slow axes.

The first substrate and the third substrate may be separated from each other by a distance in which the liquid crystals are capable of changing a phase of the external light by 90 degrees.

A rotation direction of external light by the first polarizer may be opposite to a rotation direction of external light by the second polarizer.

Before forming before forming the transmittance adjusting layer, the method may include forming a protective layer for covering the first substrate comprising on the pixel electrode. After forming the transmittance adjusting layer, the method may include removing the protective layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
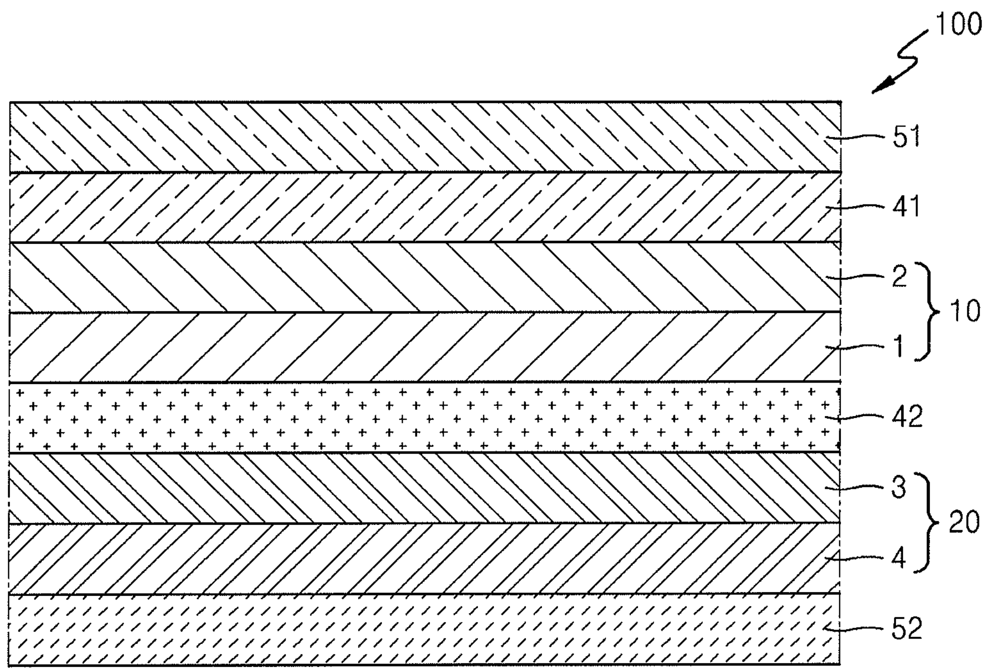
FIG. 1 is a cross-sectional view of a display apparatus according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals in the drawings denote like elements. In the following description, well-known functions or constructions are not described in detail since they would obscure the description with unnecessary detail.

While terms “first” and “second” are used to describe various components, it is obvious that the components are not limited to the terms “first” and “second”. The terms “first” and “second” are used only to distinguish between each component.

Furthermore, all examples and conditional language recited herein are to be construed as being without limitation to such specifically recited examples and conditions. Throughout the specification, a singular form may include plural forms, unless there is a particular description contrary thereto. Also, terms such as “comprise” or “comprising” are used to specify existence of a recited form, a number, a process, an operation, a component, and/or groups thereof, not excluding the existence of one or more other recited forms, one or more other numbers, one or more other processes, one or more other operations, one or more other components and/or groups thereof.

In the drawings, the thicknesses of layers and regions are exaggerated for clarity.

Also, it will be understood that when an element or layer is referred to as being “on” another element or layer, the element or layer can be directly on another element or layer or intervening elements or layers.

Hereinafter, the inventive concept will be described in detail by explaining exemplary embodiments of the inventive concept with reference to the attached drawings.

As used herein, the term “and/or” includes any and all combinations of one or more of the associated listed items. Expressions such as “at least one of,” when preceding a list of elements, modify the entire list of elements and do not modify the individual elements of the list.

FIG. 1 is a cross-sectional view of a display apparatus 100 according to an embodiment of the inventive concept. Referring to FIG. 1, the display apparatus 100 sequentially includes a first linear polarizer 51, a first retarder 41, a transparent display device 10, a second retarder 42, a transmittance adjusting device 20, and a second linear polarizer 52.

The transparent display device 10 may be a bottom emission type organic light-emitting display apparatus, and may include a first substrate 1, a display unit (not shown) on the first substrate 1, and a second substrate 2 encapsulating the display unit. Alternatively, the transparent display device 10 may be a top emission type organic light-emitting display apparatus, and may include the second substrate 2, the display unit (not shown) on the second substrate 2, and the first substrate 1 encapsulating the display unit.

The display unit is defined by a plurality of pixels. In this regard, each of the pixels includes a pixel region that emits light of a light-emitting device, and a transmission region that is adjacent to the pixel region and transmits external light.

The transmittance adjusting device 20 may include a third substrate 3, a fourth substrate 4, and liquid crystals (not shown) encapsulated between the third substrate 3 and the fourth substrate 4. The liquid crystals may be in a twisted nematic (TN) mode. The liquid crystals may retard incident light by 0 through +½ wavelength (+λ/2).

The first retarder 41 and the first linear polarizer 51 are on an exterior side of the second substrate 2 of the transparent display device 10. A combination of the first retarder 41 and the first linear polarizer 51 transmits circularly polarized light that rotates in a predetermined direction. In particular, the first linear polarizer 51 linearly polarizes incident light in a predetermined direction, and the first retarder 41 phase-retards the incident light by +¼ wavelength (+λ/4).

The second retarder 42 is between the transparent display device 10 and the transmittance adjusting device 20, and the second linear polarizer 52 is an exterior side of the fourth substrate 4 of the transmittance adjusting device 20. A combination of the second retarder 42 and the second linear polarizer 52 may transmit circularly polarized light that rotates in a predetermined direction. Here, the second linear polarizer 52 linearly polarizes incident light in a predetermined direction, and the second retarder 42 phase-retards the incident light by −¼ wavelength (−λ/4), i.e., opposite that of the combination of the first retarder 41 and the first linear polarizer 51.

The present embodiment of FIG. 1 discloses the display apparatus 100 including various optical members such as the transmittance adjusting device 20, the first linear polarizer 51, the first retarder 41, the second retarder 42, the second linear polarizer 52, and the like, and can adjust transmittance of external light by using the optical members.

Figure 2:
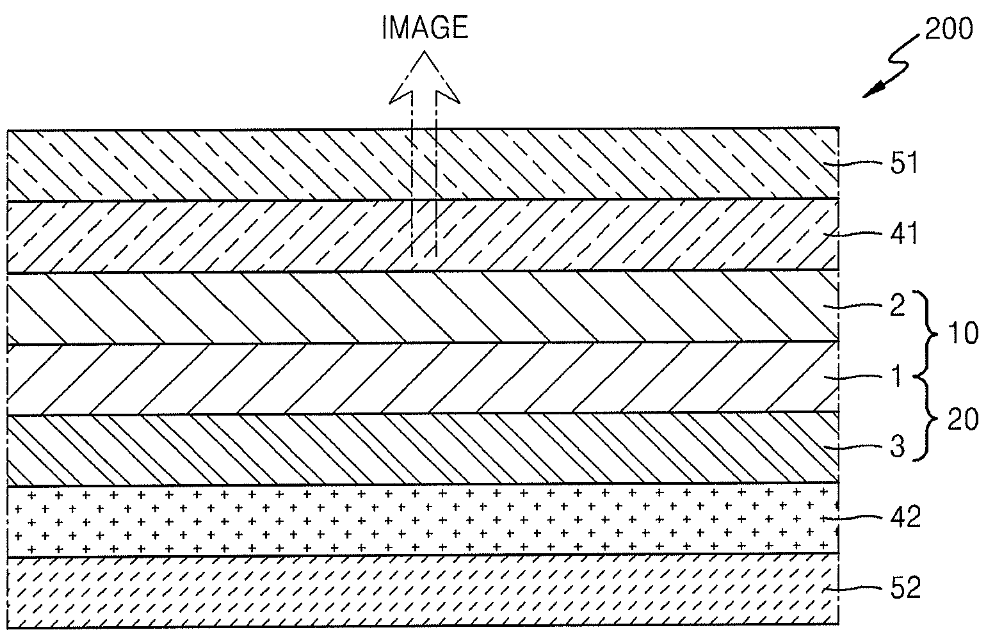
FIG. 2 is a cross-sectional view of a display apparatus according to another embodiment of the inventive concept.

FIG. 2 is a cross-sectional view of a display apparatus 200 according to another embodiment of the inventive concept. Referring to FIG. 2, the display apparatus 200 includes the transparent display device 10 capable of transmitting external light and the transmittance adjusting device 20 for adjusting transmittance of the external light.

The display apparatus 100 of FIG. 1 uses four transparent substrates: the first substrate 1 and the second substrate 2 which form the transparent display device 10, and the third substrate 3 and the fourth substrate 4 which form the transmittance adjusting device 20. On the other hand, the display apparatus 200 of FIG. 2 is different from the embodiment of FIG. 1 in that the transparent display device 10 and the transmittance adjusting device 20 share one substrate, i.e., the first substrate, so that the number of substrates may be reduced.

The transparent display device 10 may be a top emission type organic light-emitting display apparatus, and may include the first substrate 1, the display unit (not shown) on the first substrate 1, and the second substrate 2 encapsulating the display unit. The display unit is defined by a plurality of pixels. In this regard, each of the pixels includes a pixel region that emits light in a direction of the second substrate 2, and a transmission region that is adjacent to the pixel region and transmits external light.

The first retarder 41 and the first linear polarizer 51 are disposed in a sequential manner on an exterior side of the second substrate 2 via which the transparent display device 10 emits light. A combination of the first linear polarizer 51 and the first retarder 41 transmits circularly polarized light that rotates in a predetermined direction. That is, the combination of the first linear polarizer 51 and the first retarder 41 may transmit only one of left circularly polarized light and right circularly polarized light, may decrease reflection of external light on a front surface of the display apparatus 200, and thus, may allow a user to clearly view an image. Here, the first linear polarizer 51 linearly polarizes incident light in a predetermined direction and the first retarder 41 phase-retards the incident light by +¼ wavelength (+λ/4).

The transmittance adjusting device 20, the second retarder 42, and the second linear polarizer 52 are disposed in a sequential manner on an exterior side of the first substrate 1 via which the transparent display device 10 does not emit light.

The transmittance adjusting device 20 includes the first substrate 1 of the transparent display device 10, the third substrate 3 disposed facing the first substrate 1, and liquid crystals (not shown) that are disposed between the first substrate 1 and the third substrate 3 and of which an alignment is changed in response to an electric field applied thereto. Because the liquid crystals are changed by a voltage difference, the liquid crystals may realize a uniform phase difference with respect to an entire area, may consume low power, and may be inexpensive. In the present embodiment, the liquid crystals are in a vertical alignment nematic (VAN) mode. The liquid crystals in the VAN mode are vertically aligned when the display apparatus 200 is in an opaque state (i.e., a black mode), and are horizontally aligned when the display apparatus 200 is in a transparent state (i.e., a transmittance mode). The liquid crystals may retard incident light by 0 through +½ wavelength (+λ/2).

The second retarder 42 and the second linear polarizer 52 are disposed on an exterior side of the third substrate 3. A combination of the second linear polarizer 52 and the second retarder 42 transmits circularly polarized light that rotates in a predetermined direction. That is, the combination of the second linear polarizer 52 and the second retarder 42 may transmit only one of left circularly polarized light and right circularly polarized light, may decrease reflection of external light on a rear surface of the display apparatus 200, and thus, may allow a user to clearly view an image. Here, the second linear polarizer 52 linearly polarizes incident light in a predetermined direction, and the second retarder 42 phase-retards the incident light by −¼ wavelength (−λ/4).

According to the present embodiment, in the display apparatus 200, the first linear polarizer 51 and the second linear polarizer 52 may have the same polarization axes (or absorption axes). Also, the first retarder 41 and the second retarder 42 may have the same slow axes. Also, the liquid crystals in the VAN mode of a liquid crystal layer are aligned to be perpendicular to surfaces of the first and third substrates 1 and 3 while an electric field is not applied thereto. However, when an electric field is applied thereto, the liquid crystals are horizontally aligned in a direction perpendicular to the slow axes of the first retarder 41 and the second retarder 42. Because the liquid crystals in the VAN mode are horizontally aligned in a transmittance mode, the aforementioned relationship among the linear polarizers, the retarders, and the liquid crystals functions to remove chromatic aberration of light that is transmitted when the liquid crystals in the VAN mode are horizontally aligned.

The present embodiment of FIG. 2 discloses the display apparatus 200 including optical members such as the transmittance adjusting device 20, the first linear polarizer 51, the first retarder 41, the second retarder 42, the second linear polarizer 52, and the like, and may adjust transmittance of external light by using the optical members and to remove reflection of the external light, e.g., due to metal included in the transparent display device 10. That is, according to the present embodiment, by uniquely disposing the transmittance adjusting device 20 and various optical members, transmittance of the display apparatus 200 may be adjusted with low power consumption, and the reflection of the external light due to the metal may be reduced or removed, so that visibility of the display apparatus 200 may be improved.

Also, according to the present embodiment, one of two substrates for encapsulating the liquid crystals of the transmittance adjusting device 20 is used for one of two substrates of the transparent display device 10, so that transmittance of the external light may be adjusted via a minimum number of additional members. Thus, compared to the display apparatus 100 of FIG. 1, the number of required substrates may be reduced in the display apparatus 200 of FIG. 2, so that a weight and material costs of the display apparatus 200 may be reduced.

In order to share a substrate to encapsulate the liquid crystals between the transmittance adjusting device 20 and the transparent display device 10, if the second retarder 42 is disposed between the first substrate 1 and the third substrate 3, i.e., if the second retarder 42 is disposed on a surface of the first substrate 1 in the display apparatus 100 of FIG. 1, the second retarder 42 has not to obstruct an alignment layer formed on the first substrate 1. Also, because the second retarder 42 is a $-\lambda/4$ layer that is very thin, it is very difficult to handle the second retarder 42. Also, the second retarder 42 has not to be damaged while the alignment layer is formed and then is rubbed, and has to be optically index matched not to lose optical transmittance. However, because the $-\lambda/4$ layer is formed via a stretch process, its optical characteristic may be changed by external pressure in one direction due to a rubbing operation, so that a very difficult process is required. Thus, in the display apparatus 200 of FIG. 2, the second retarder 42 is not disposed between the first substrate 1 and the third substrate 3 but is disposed on an exterior side of the third substrate 3. Also, the liquid crystals are in the VAN mode. Because liquid crystals in the TN mode do not react with circularly polarized light, it is impossible to dispose the second retarder 42 on the exterior side of the third substrate 3. Thus, by disposing the second retarder 42 on the exterior side of the third substrate 3 while the liquid crystals in the VAN mode are used, the second retarder 42 that is the $-\lambda/4$ layer is not relevant to a transparent electrode (ITO) and the rubbing operation to form the alignment layer.

Figure 3:
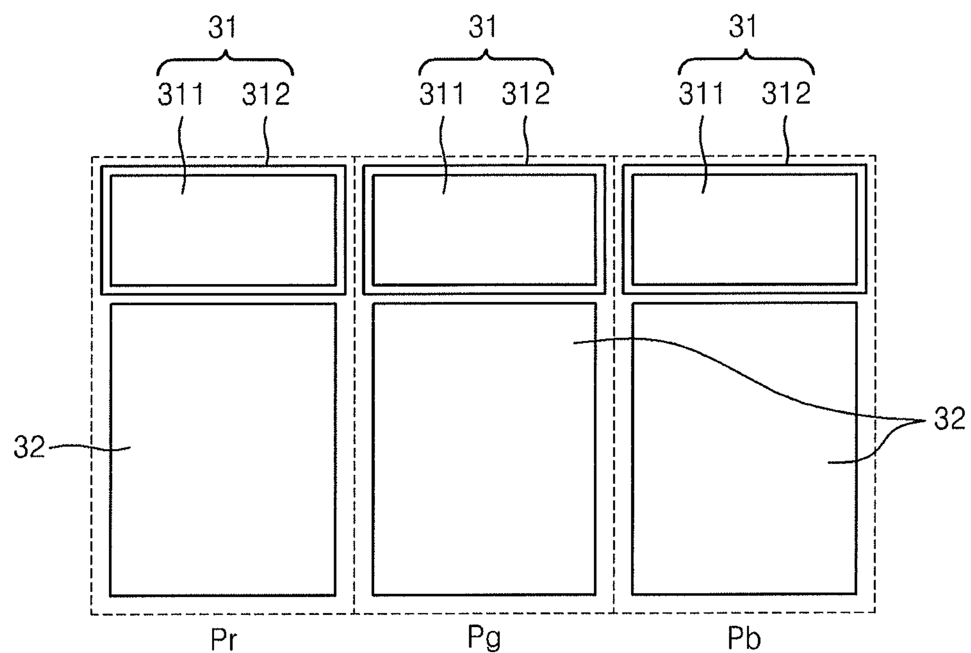
FIGS. 3 and 4 are diagrams of pixels included in the transparent display device of FIG. 2, according to embodiments of the inventive concept.
Figure 4:
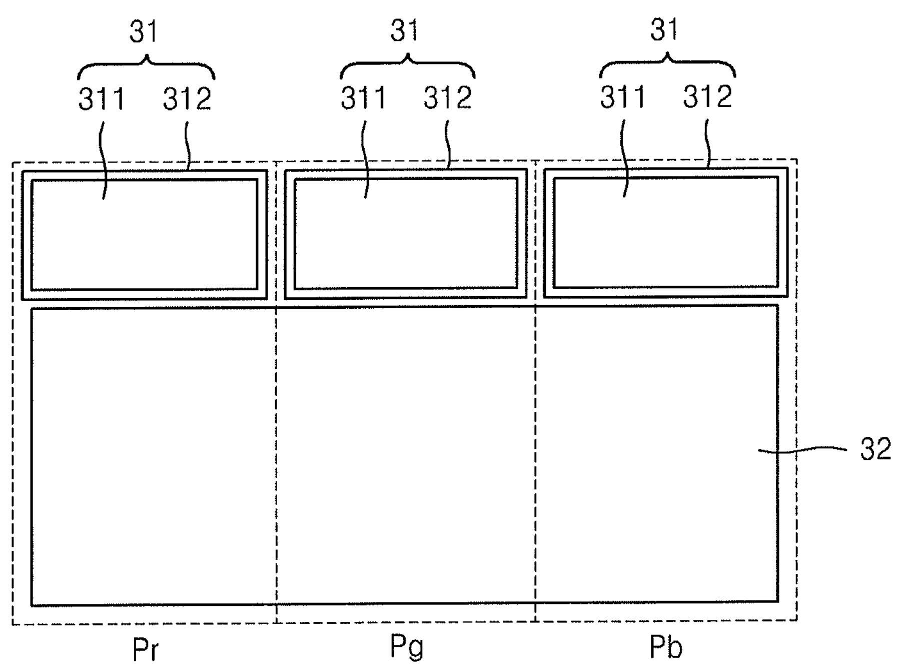

FIG. 3 is a diagram of a pixel included in the transparent display device 10 of FIG. 2, according to an embodiment of the inventive concept. FIG. 4 is a diagram of another example of the pixel according to another embodiment of the inventive concept.

Each pixel may include a plurality of sub-pixels, e.g., a sub-pixel Pr for red, a sub-pixel Pg for green, and a sub-pixel Pb for blue. Each of the sub-pixels Pr, Pg, and Pb includes a pixel region 31 and a transmission region 32.

The pixel region 31 includes a pixel circuit unit 311 and an emission unit 312 that are disposed to overlap with each other. Because the emission unit 312 completely emits light toward the second substrate 2, the pixel circuit unit 311 and the emission unit 312 may overlap with each other. In addition, because the emission unit 312 covers the pixel circuit unit 311 including a pixel circuit (not shown), an optical interference due to the pixel circuit may be removed.

The transmission region 32 that transmits external light is disposed adjacent to the pixel region 31. As illustrated in FIG. 3, the transmission region 32 may be included in each of the sub-pixels Pr, Pg, and Pb, or, as illustrated in FIG. 4, the transmission region 32 may extend continuously over all of the sub-pixels Pr, Pg, and Pb. That is, in a display unit, the pixel may include a plurality of the pixel regions 31 that are separated from each other by transmission regions 32 as shown in FIG. 3. In the embodiment of FIG. 4, an area of the transmission region 32 that transmits external light is enlarged so that transmittance of the entire display unit may be increased.

Figure 5:
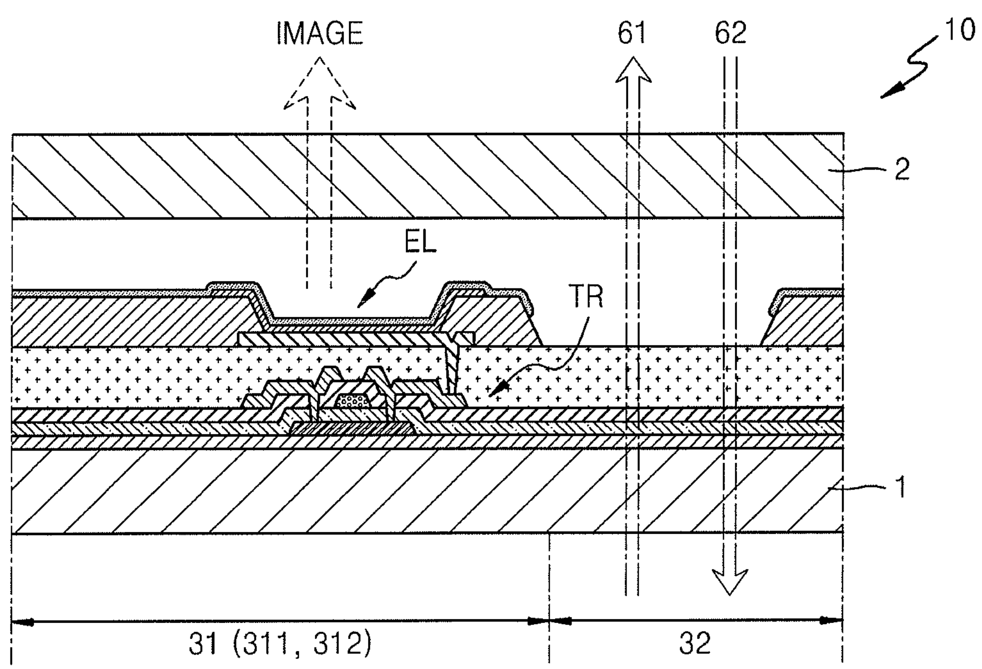
FIG. 5 is a cross-sectional view of one of a plurality of sub-pixels shown in FIGS. 3 and 4.

FIG. 5 is a cross-sectional view of one of the sub-pixels Pr, Pg, and Pb shown in FIGS. 3 and 4. As illustrated in FIG. 5, a thin-film transistor (TFT) TR is disposed in the pixel circuit unit 311 of the pixel region 31. However, the number of TFT TRs is not limited to one TFT TR, and the pixel circuit unit 311 may include a pixel circuit including the TFT TR. For example, the pixel circuit may include a plurality of TFTs and storage capacitors, and may further include scan lines, data lines, and Vdd lines that are connected to the TFTs and the storage capacitors.

An organic light-emitting device EL that is a light-emitting device is disposed in the emission unit 312 of the pixel region 31. The organic light-emitting device EL is electrically connected to the TFT TR of the pixel circuit.

According to the present embodiment, when the display apparatus 200 is in a transparent mode that transmits light, a user on an image realization side may view an image on an exterior side of the first substrate 1 via first external light 61 that is transmitted from an exterior side of the first substrate 1 toward an exterior side of the second substrate 2. Also, a user on an opposite side of the image realization side may view an image on the exterior side of the second substrate 2 via second external light 62 that is transmitted from the exterior side of the second substrate 2 toward the exterior side of the first substrate 1. Here, the first external light 61 travels in a direction equal to that of the image, and the second external light 62 travels in a direction opposite to the direction of the first external light 61.

When the display apparatus 200 is in a black mode where light is not transmitted, the user on the image realization side may not view the image on the exterior side of the first substrate 1. Also, the user on the opposite side of the image realization side may not view the image on the exterior side of the second substrate 2.

Figure 6A:
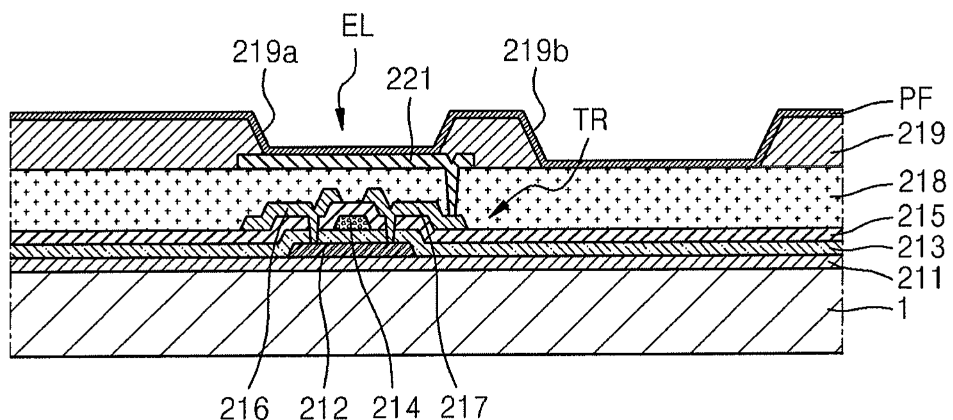
FIGS. 6A through 6G are cross-sectional views illustrating stages in a method of manufacturing the display apparatus of FIG. 2, according to an embodiment of the inventive concept.

FIGS. 6A through 6G are cross-sectional views illustrating stages in a method of manufacturing the display apparatus 200 of FIG. 2, according to an embodiment of the inventive concept. Referring to FIG. 6A, first, a buffer layer 211 may be formed on the first substrate 1, and the pixel circuit including the TFT TR is formed on the buffer layer 211. The first substrate 1 may be formed of a transparent glass material containing $SiO_2$ as a main component.

When employed, the buffer layer 211 may function to prevent penetration of foreign materials and to planarize a surface of the first substrate 1, and may be formed of various materials capable of performing these functions. For example, the buffer layer 211 may be formed of an inorganic material including silicon oxide, silicon nitride, silicon oxynitride, aluminum oxide, aluminum nitride, titanium oxide, or titanium nitride, an organic material including polyimide, polyester, acryl, or the like, or a stack including the inorganic material and the organic material. A semiconductor active layer 212 is formed on the buffer layer 211. The semiconductor active layer 212 may be formed of polycrystalline silicon.

A gate insulating layer 213 may be formed on the buffer layer 211 so as to cover the semiconductor active layer 212. A gate electrode 214 is formed on the gate insulating layer 213.

An interlayer insulating layer 215 is formed on the gate insulating layer 213 so as to cover the gate electrode 214. Then, a source electrode 216 and a drain electrode 217 are formed on the interlayer insulating layer 215 and contact the semiconductor active layer 212 via contact holes, respectively.

However, a structure of the TFT TR is not limited to the aforementioned structure, and thus may vary.

A passivation layer 218 is formed to cover the TFT TR. The passivation layer 218 may include a single insulating layer or a plurality of insulating layers with planarized top surfaces. The passivation layer 218 may be formed of an inorganic material and/or an organic material. The passivation layer 218 may be formed to cover all of the pixel region 31 and the transmission region 32. However, a structure of the passivation layer 218 is not limited thereto and thus may include an opening (not shown) at a location corresponding to the transmission region 32. By doing so, external light transmittance efficiency of the transmission region 32 may be further increased.

A first electrode 221 of an organic light-emitting device EL is formed on the passivation layer 218 to electrically connect to the TFT TR. The first electrode 221 has an island form that is separate for each pixel. The first electrode 221 is located in an emission unit 312 of the pixel region 31 and overlaps a pixel circuit unit 311 so as to cover the pixel circuit unit 311.

According to the present embodiment, the first electrode 221 may have a stack structure including a transparent conductor and a reflective layer. Here, the transparent conductor may be formed of ITO, IZO, ZnO, or In2O3, which has a high work function. The reflective layer may include at least one metal selected from the group consisting of Ag, Mg, Al, Pt, Pd, Au, Ni, Nd, Ir, Cr, Li, Ca, Mo, and an alloy thereof.

A pixel-defining layer (PDL) 219 formed of an organic insulating material and/or an inorganic insulating material is formed on the passivation layer 218.

The PDL 219 has a first opening **219*a* to expose a central region of the first electrode 221, while the PDL 219 cover an edge, e.g., a periphery, of the first electrode 221. The PDL 219 may cover the pixel region 31. In this regard, the PDL 219 may not completely cover the pixel region 31, but may cover at least one portion, particularly, the edge of the first electrode 221. The PDL 219 may have a second opening 219*b* at a location corresponding to the transmission region 32. Because the PDL 219 is not located in the transmission region 32, external light transmittance efficiency of the transmission region 32** may be further increased.

The passivation layer 218 and the PDL 219 may be formed of a transparent material. Because insulating layers are formed of a transparent material, external light transmittance efficiency of the transparent display device 10 may be further increased.

A protection film (PF) that completely covers the PDL 219 and the first substrate 1 is formed. The PF is formed to protect the pixel circuit while a transmittance adjusting device 20 is formed in a subsequent process. A pixel circuit forming process requires a maximum processing temperature of 500° C. Thus, the pixel circuit forming process is previously performed before a process of forming the transmittance adjusting device 20 is performed.

Figure 6B:
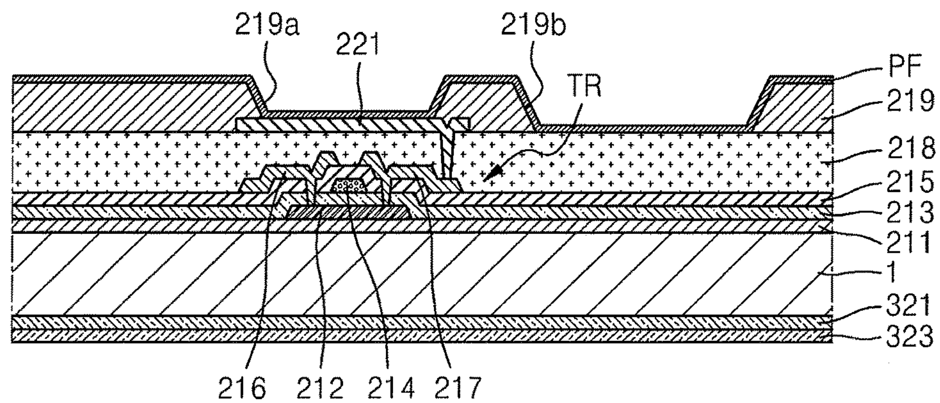

Referring to FIG. 6B, a third electrode 321 and a first alignment layer 323 are sequentially formed on a second surface, opposite a first surface of the first substrate 1 on which the pixel circuit is formed.

The third electrode 321 may be formed as a transparent conductive layer including at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first alignment layer 323 is formed on the third electrode 321 via a rubbing process in a predetermined direction.

Figure 6C:
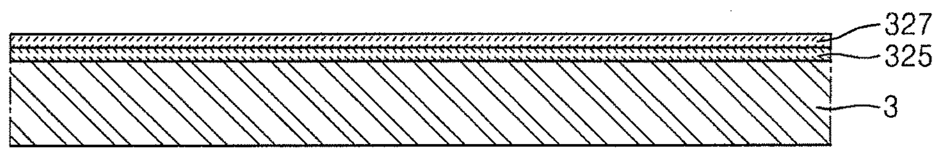

Referring to FIG. 6C, a fourth electrode 325 and a second alignment layer 327 are sequentially formed on the third substrate 3. The third substrate 3 may be formed of a transparent glass material containing $SiO_2$ as a main component. The fourth electrode 325 may be formed as a transparent conductive layer including at least one selected from the group consisting of ITO, IZO, ZnO, $In_2O_3$, IGO, and AZO.

The second alignment layer 327 is formed on the fourth electrode 325 via a rubbing process in a predetermined direction. A rubbing axis of the first alignment layer 323 and a rubbing axis of the second alignment layer 327 may have a predetermined angle with respect to each other. The first alignment layer 323 and the second alignment layer 327 are formed as vertical alignment layers via a rubbing operation. Accordingly, liquid crystals without an electrical field are perpendicular to surfaces of the alignment layers.

As illustrated in FIGS. 6B and 6C, the third electrode 321 and the fourth electrode 325 may be formed on an entire surface of a substrate or may be formed to correspond to the transmission region 32.

Figure 6D:
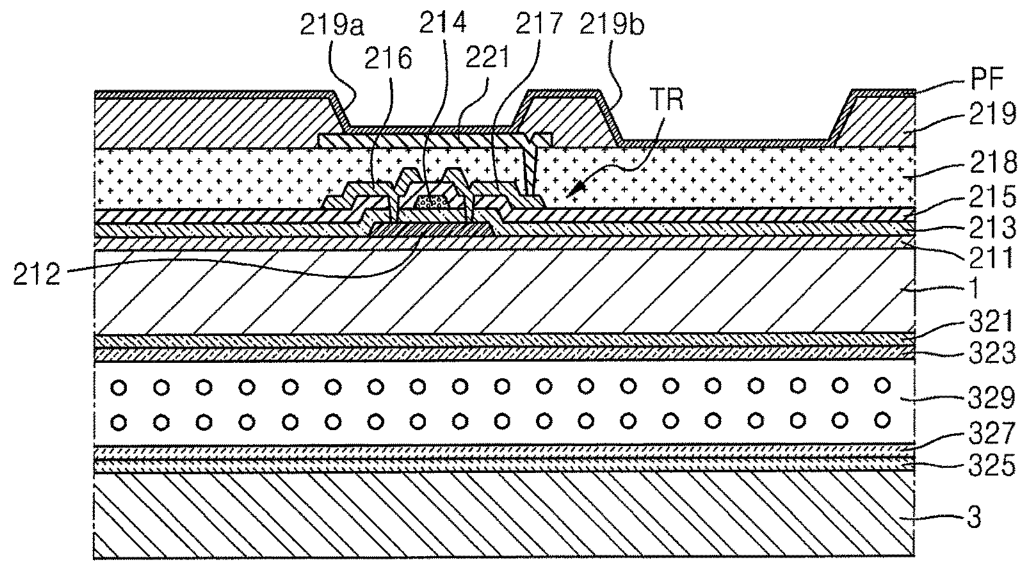

Referring to FIG. 6D, liquid crystals in a VAN mode are injected into the first substrate 1, which is a result of the process shown in FIG. 6B, and then the first substrate 1 and the third substrate 3, which is a result of the process shown in FIG. 6C, are sealed to encapsulate the liquid crystals in a VAN mode. Accordingly, a liquid crystal layer 329 is disposed between the first substrate 1 and the third substrate 3, thereby forming the transmittance adjusting device 20.

A distance between the first substrate 1 and the third substrate 3 may be set such that a phase of transmitted light may be changed by 90 degrees ($\lambda/2$).

Processes of forming and encapsulating the organic light-emitting device EL are performed at a temperature equal to or less than 50° C., so that the processes do not damage the liquid crystals. Thus, after a process of forming the transmittance adjusting device 20, which uses the liquid crystals, is performed, processes below are performed.

Figure 6E:
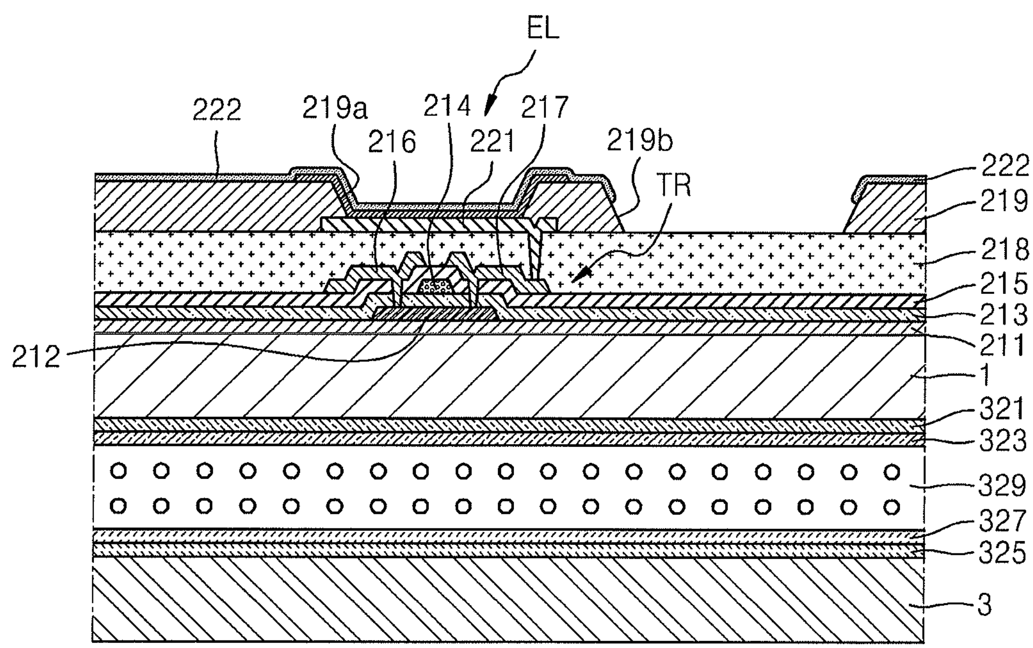

Referring to FIG. 6E, the PF that is attached on the first substrate 1 on which the transmittance adjusting device 20 is formed is removed, and the organic light-emitting device EL is formed.

An organic layer 223 and a second electrode 222 are sequentially stacked on the first electrode 221 that is exposed via the third opening 219*a*. The second electrode 222 may be formed at least in the pixel region 31 and may have a third opening 222*a* at a location corresponding to the transmission region 32. Because the second electrode 222 is not located in the transmission region 32, external light transmittance efficiency of the transmission region 32 may be further increased. The third opening 222*a* and the second opening 219*b* may be connected to each other.

The organic layer 223 may be formed as a small molecule organic layer or a polymer organic layer. When the organic layer 223 is formed as the small molecule organic layer, the organic layer 223 may have a structure in which a hole injection layer (HIL), a hole transport layer (HTL), an emission layer (EML), an electron transport layer (ETL), an electron injection layer (EIL), or the like are singularly or multiply stacked, and may be formed by using one of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like. The small molecule organic layer may be formed using a vacuum deposition process. Here, the HIL, the HTL, the ETL, the EIL, and the like are common layers that may be commonly applied to red, green, and blue pixels.

In a case where the organic light-emitting device EL is a full-color organic light-emitting device, the EML may be patterned to a red EML, a green EML, and a blue EML, according to a red sub-pixel, a green sub-pixel, and a blue sub-pixel, respectively. Here, a styryl-based compound or styryl-based compound containing composition may be included as a blue phosphor dopant in the blue EML. The EML may have a multi-stack structure in which the red EML, the green EML, and the blue EML are stacked or may have a single-layer structure including a red emission material, a green emission material, and a blue emission material. The organic light-emitting device EL including the EML may emit a full-color by additionally including a red color filter, a green color filter, and a blue color filter.

The first electrode 221 may function as an anode electrode, and the second electrode 222 may function as a cathode electrode. However, polarities of the first electrode 221 and the second electrode 222 may be switched.

The second electrode 222 may be a transflective electrode and may be formed of Ag, Mg, Al, Pt, Pd, Au, Ni, Nd, Ir, Cr, Li, Ca, Mo, or an alloy thereof. Here, in order to have a high transmittance rate, the second electrode 222 may be formed as a thin layer having a thickness of 100 through 300 Å. Thus, the organic light-emitting device EL corresponds to a top emission type organic light-emitting device that realizes an image toward the second electrode 222.

Figure 6F:
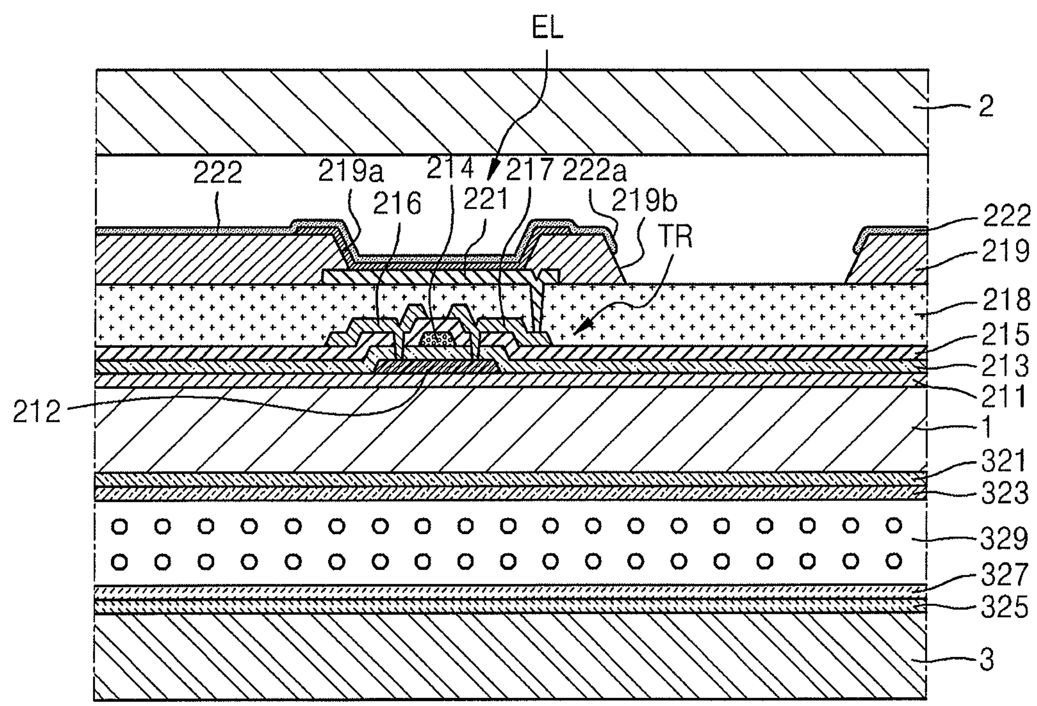

Referring to FIG. 6F, the second substrate 2 that faces the first substrate 1 encapsulates the first substrate 1 by using a sealing member. The second substrate 2 may be formed of a transparent glass material containing $SiO_2$ as a main component. Alternatively, instead of the second substrate 2 formed of a glass material, a thin film encapsulation (TFE) member may encapsulate the first substrate 1.

Figure 6G:
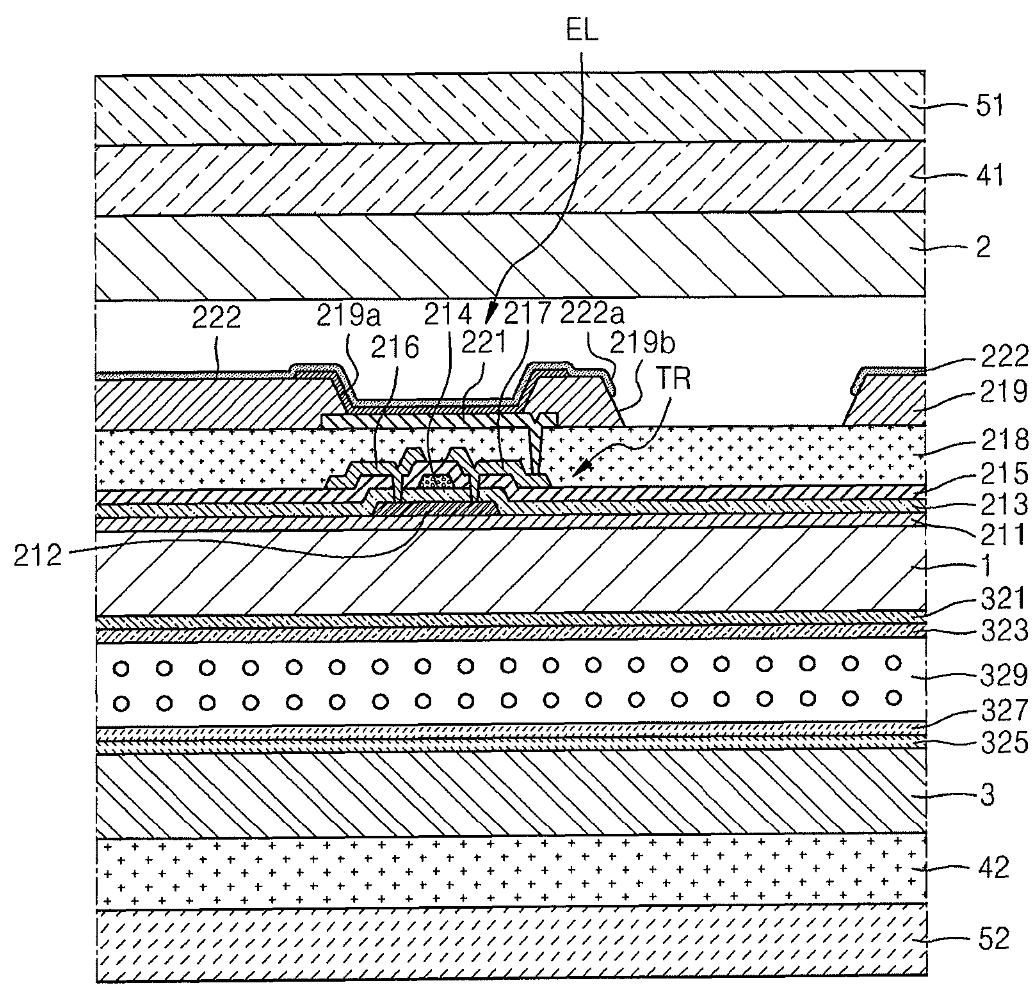

Referring to FIG. 6G, the first retarder 41 and the first linear polarizer 51 are sequentially formed on an exterior side of the second substrate 2. Also, the second retarder 42 and the second linear polarizer 52 are sequentially formed on an exterior side of the third substrate 3. The first retarder 41 and the first linear polarizer 51, and the second retarder 42 and the second linear polarizer 52 may be a film type and may be attached on the second substrate 2 and the third substrate 3, respectively.

Figure 7:
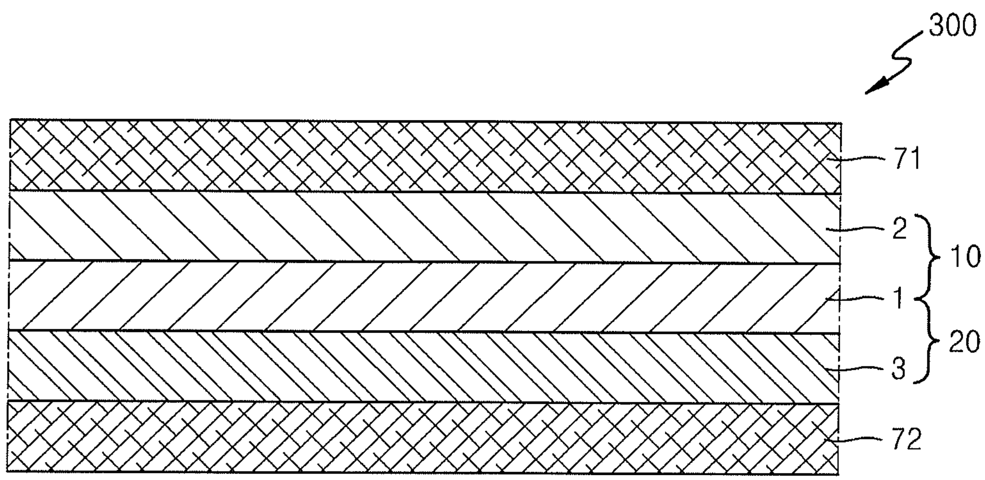
FIG. 7 is a cross-sectional view of a display apparatus according to another embodiment of the inventive concept.

FIG. 7 is a cross-sectional view of a display apparatus 300 according to another embodiment of the inventive concept.

In the display apparatus 300 of FIG. 7, a first circular polarizer 71 is disposed on an exterior side of a second substrate 2 and a second circular polarizer 72 is disposed on an exterior side of a third substrate 3. Other elements of the display apparatus 300 of FIG. 7 have functions that are substantially the same as functions of corresponding elements of the embodiment shown in FIG. 2. Thus, detailed descriptions thereof are omitted here.

The first circular polarizer 71 and the second circular polarizer 72 may be optical films having a circular polarization function. Thus, the display apparatus 300 of FIG. 7 may be manufactured via a simple process of attaching an optical film-type circular polarizer to exterior surfaces of the second substrate 2 and the third substrate 3. Thus, the display apparatus 300 may be manufactured where two processes of attaching a retarder and a linear polarizer in the display apparatus 200 of FIG. 2 are reduced to one process of attaching a circular polarizer. Also, it is not required to separately adjust an anti-reflect (AR) characteristic of the retarder, and in this regard, an AR characteristic is adjusted by the circular polarizer, so that a whole process may be simplified.

Figure 8:
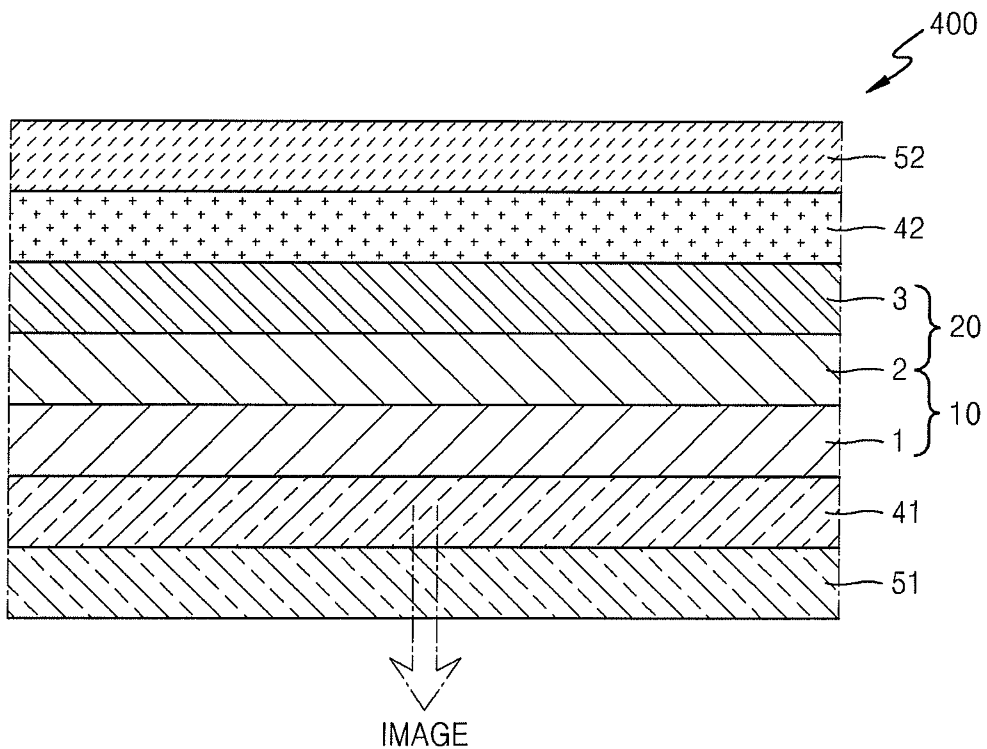
FIG. 8 is a cross-sectional view of a display apparatus according to another embodiment of the inventive concept.

FIG. 8 is a cross-sectional view of a display apparatus 400 according to another embodiment of the inventive concept.

Unlike the display apparatus 200 of FIG. 2, the display apparatus 400 of FIG. 8 may be an organic light-emitting display apparatus in which the transparent display device 10 is a bottom emission type display device. Thus, the first retarder 41 and the first linear polarizer 51 are disposed in a sequential manner on an exterior side of the first substrate 1 via which the transparent display device 10 emits light. Also, the transmittance adjusting device 20, the second retarder 42, and the second linear polarizer 52 are disposed in a sequential manner on an exterior side of a second substrate 2 via which the transparent display device 10 does not emit light. Other elements of the display apparatus 400 of FIG. 8 have functions that are substantially the same as functions of corresponding elements of the embodiment shown in FIG. 2. Thus, detailed descriptions thereof are omitted here.

Figure 9:
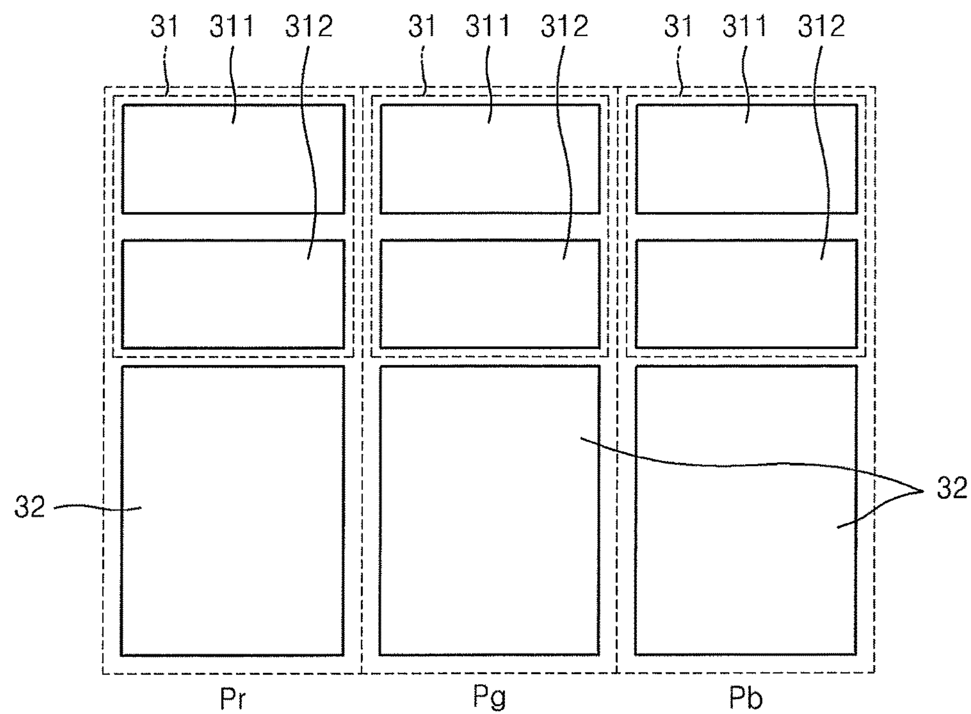
FIGS. 9 and 10 are diagrams of pixels included in a transparent display device of FIG. 8, according to embodiments of the inventive concept.
Figure 10:
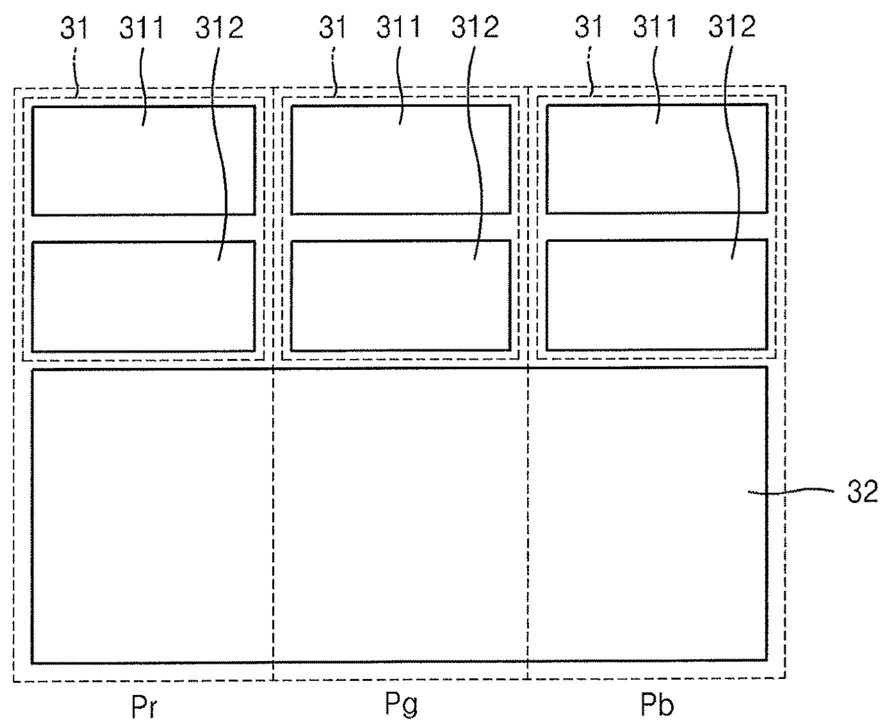

FIG. 9 is a diagram of a pixel included in the transparent display device 10 of FIG. 8, according to an embodiment of the inventive concept. FIG. 10 is a diagram of a pixel included in the transparent display device 10 of FIG. 8, according to another embodiment of the inventive concept.

Unlike the pixels shown in FIGS. 3 and 4, the pixels shown in FIGS. 9 and 10 are disposed adjacent to each other so that the pixel circuit unit 311 and the emission unit 312 which are included in the pixel region 31 do not overlap each other. By doing so, when bottom emission by the emission unit 312 is performed toward the first substrate 1, an optical path of the bottom emission is not disturbed by the pixel circuit unit 311. Other elements of the pixels shown in FIGS. 9 and 10 have functions that are substantially the same as functions of corresponding elements of the pixels shown in FIGS. 3 and 4. Thus, detailed descriptions thereof are omitted here.

As illustrated in FIG. 9, a transmission region 32 may be independently arranged in each sub-pixel Pr, Pg, and Pb, or as illustrated in FIG. 10, the transmission region 32 may extend over the sub-pixels Pr, Pg, and Pb.

Figure 11:
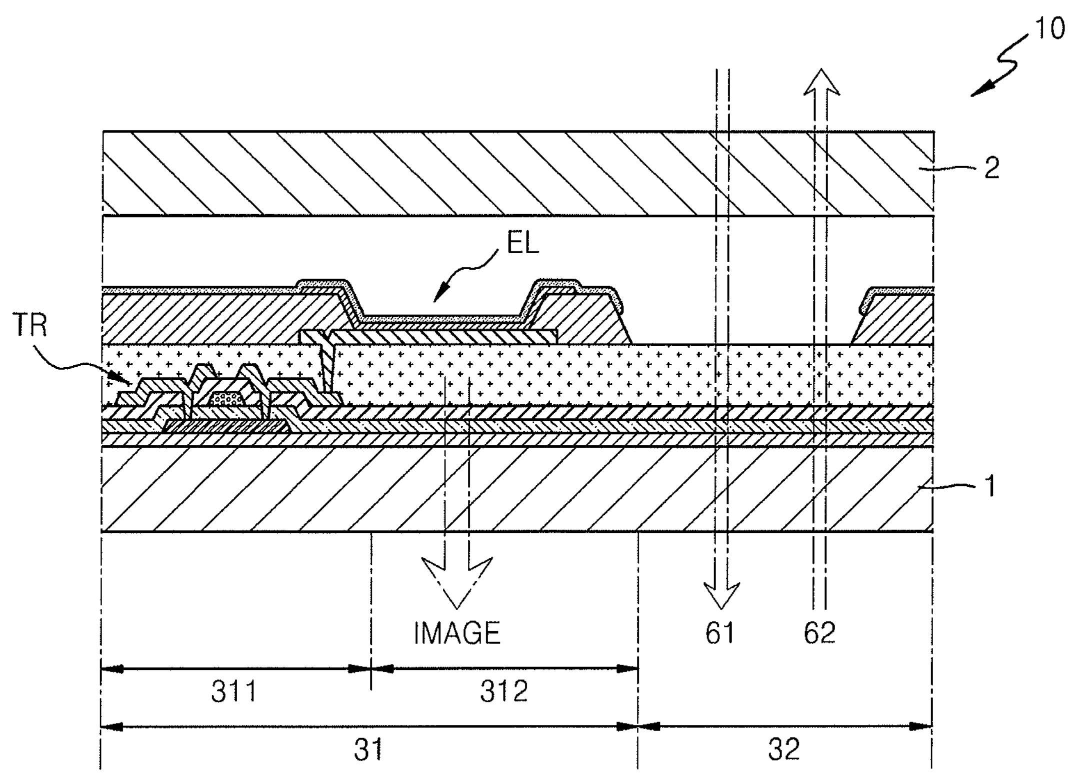
FIG. 11 is a cross-sectional view of one of a plurality of sub-pixels shown in FIGS. 9 and 10.

FIG. 11 is a cross-sectional view of one of the sub-pixels Pr, Pg, and Pb shown in FIGS. 9 and 10.

As illustrated in FIG. 11, a TFT TR is disposed in a pixel circuit unit 311, and an organic light-emitting device EL that is a light-emitting device is disposed in an emission unit 312.

The organic light-emitting device EL is electrically connected to the TFT TR of the pixel circuit unit 311.

According to the present embodiment, when the display apparatus 400 is in a transparent mode that transmits light, a user on an image realization side may view an image on an exterior side of the second substrate 2 via first external light 61 that is transmitted from an exterior side of the second substrate 2 toward an exterior side of the first substrate 1. Also, a user on an opposite side of the image realization side may view an image on the exterior side of the first substrate 1 via second external light 62 that is transmitted from the exterior side of the first substrate 1 toward the exterior side of the second substrate 2. Here, the first external light 61 travels in a direction equal to that of the image, and the second external light 62 travels in a direction opposite to the direction of the first external light 61.

When the display apparatus 400 is in a black mode where light is not transmitted, the user on the image realization side may not view the image on the exterior side of the second substrate 2. Also, the user on the opposite side of the image realization side may not view the image on the exterior side of the first substrate 1.

Figure 12:
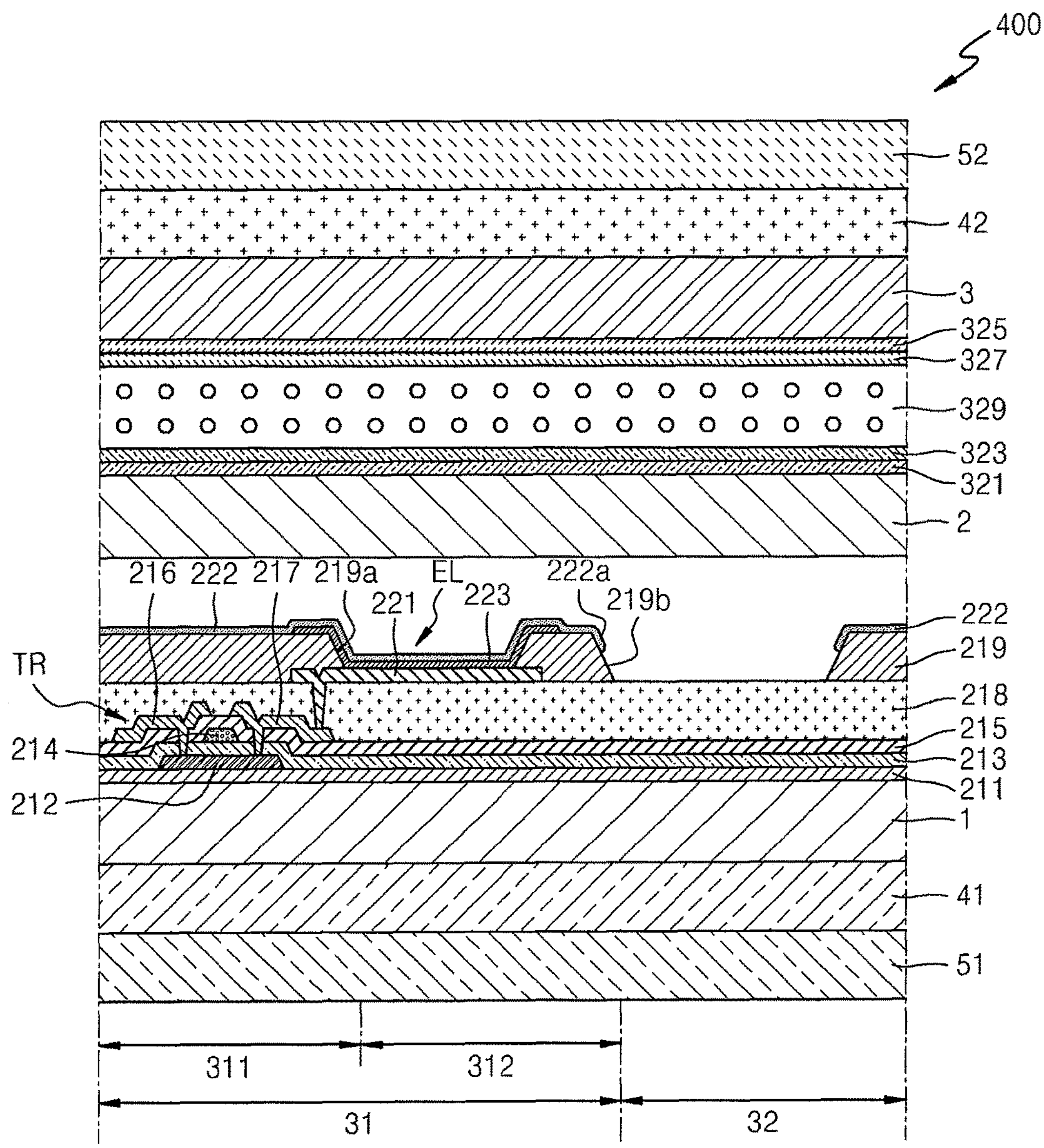
FIG. 12 is a cross-sectional view of the display apparatus shown in FIG. 8.

FIG. 12 is a cross-sectional view of the display apparatus 400 shown in FIG. 8. Hereinafter, detailed descriptions regarding the same elements as those described with reference to FIGS. 5 and 6G are omitted.

Referring to FIG. 12, the buffer layer 211 is formed on the first substrate 1, and the semiconductor active layer 212 is formed on the buffer layer 211. The semiconductor active layer 212 may be formed of polycrystalline silicon, but is not limited thereto. For example, the semiconductor active layer 212 may be an oxide semiconductor. For example, the semiconductor active layer 212 may be a G-I-Z-O layer [an $(In_2O_3)a(Ga_2O_3)b(ZnO)c$ layer] (where a, b, c are real numbers that satisfy conditions of $a \geq 0$, $b \geq 0$, $c > 0$, respectively). When the semiconductor active layer 212 is formed as the oxide semiconductor, a transmittance in the pixel circuit unit 311 of the pixel region 31 may be further increased, so that an external light transmittance of an entire display unit may be increased.

The gate insulating layer 213, the gate electrode 214, and the interlayer insulating layer 215 are formed on the semiconductor active layer 212. Then, the source electrode 216 and the drain electrode 217 are formed on the interlayer insulating layer 215, and contact the semiconductor active layer 212 via contact holes, respectively.

However, a structure of the TFT TR is not limited to the aforementioned structure, and thus may vary.

The passivation layer 218 is formed as an insulating layer to cover the TFT TR. The passivation layer 218 may be formed to cover all of the pixel region 31 and the transmission region 32. However, a structure of the passivation layer 218 is not limited thereto, e.g., may include an opening (not shown) at a location corresponding to the transmission region 32. By doing so, external light transmittance efficiency of the transmission region 32 may be further increased.

The first electrode 221 of the organic light-emitting device EL which is electrically connected to the TFT TR is formed on the passivation layer 218. The first electrode 221 is located in the emission unit 312 of the pixel region 31 and does not overlap with the pixel circuit unit 311.

The PDL 219 formed of an organic insulating material and/or an inorganic insulating material is formed on the passivation layer 218.

The PDL 219 has the first opening **219*a* to expose a central region of the first electrode 221, while the PDL 219 covers an edge, e.g., a periphery, of the first electrode 221. The PDL 219 may cover the pixel region 31. In this regard, the PDL 219 may not completely cover the pixel region 31, but may cover at least one portion, particularly, the edge of the first electrode 221. The PDL 219 may have the second opening 219*b* at a location corresponding to the transmission region 32. Because the PDL 219 is not located in the transmission region 32, external light transmittance efficiency of the transmission region 32** may be further increased.

The passivation layer 218 and the PDL 219 may be formed of a transparent material. Because insulating layers are formed of a transparent material, external light transmittance efficiency of the transparent display device 10 may be further increased.

The organic layer 223 and the second electrode 222 are sequentially stacked on the first electrode 221 that is exposed via the first opening **219*a*. The second electrode 222 may be formed in the pixel region 31 and may have the third opening 222*a* at a location corresponding to the transmission region 32. Because the second electrode 222 is not located in the transmission region 32, external light transmittance efficiency of the transmission region 32 may be further increased. The third opening 222*a* and the second opening 219*b*** may be connected to each other.

The organic layer 223 may be formed as a small molecule organic layer or a polymer organic layer.

According to the present embodiment, the first electrode 221 may be a transparent electrode, and the second electrode 222 may be a reflective electrode. The first electrode 221 may include a transparent conductive material including ITO, IZO, ZnO, or $In_2O_3$. Also, the second electrode 222 may be formed of Ag, Mg, Al, Pt, Pd, Au, Ni, Nd, Ir, Cr, Li, or Ca. Thus, the organic light-emitting device EL is a bottom emission type device in which an image is realized toward the first electrode 221. In this case, the second electrode 222 may have a sufficient thickness, so that a voltage drop does not occur in an entire display unit. Thus, the second electrode 222 may be applied to the display apparatus 400 having a large area.

Next, the third electrode 321 and the first alignment layer 323 are sequentially stacked on the second substrate 2, and the fourth electrode 325 and the second alignment layer 327 are sequentially stacked on the third substrate 3. The third electrode 321 and the fourth electrode 325 may be formed as a transparent conductive layer including at least one selected from the group consisting of ITO, IZO, ZnO, $In_2O_3$, IGO, and AZO. Also, the third electrode 321 and the fourth electrode 325 may be formed on an entire surface of a substrate or may be formed to correspond to the transmission region 32.

Liquid crystals in a VAN mode are injected into the second substrate 2 or the third substrate 3, and then the second substrate 2 and the third substrate 3 are sealed to encapsulate the liquid crystals in a VAN mode. Accordingly, the liquid crystal layer 329 is disposed between the second substrate 2 and the third substrate 3. The second substrate 2 and the third substrate 3 may maintain a distance so as to change a phase of transmitted light by 90 degrees ($\lambda/2$). The second substrate 2 in which the transmittance adjusting device 20 is formed encapsulates the first substrate 1 by using a sealing member. The first, second, and third substrates 1, 2, and 3 may be formed of a transparent glass material containing $SiO_2$ as a main component.

The first retarder 41 and the first linear polarizer 51 are sequentially disposed on an exterior side of the first substrate 1, and the second retarder 42 and the second linear polarizer 52 are sequentially disposed on an exterior side of the third substrate 3. The first retarder 41 and the first linear polarizer 51, and the second retarder 42 and the second linear polarizer 52 may be a film type and may be attached on the first substrate 1 and the third substrate 3, respectively. In another embodiment, as shown in the display apparatus 300 of FIG. 7, a combination of the first retarder 41 and the first linear polarizer 51 may be replaced with a first circular polarizer (not shown), and a combination of the second retarder 42 and the second linear polarizer 52 may be replaced with a second circular polarizer (not shown). The first circular polarizer and the second circular polarizer may be a film type and may be attached on the first substrate 1 and the third substrate 3, respectively.

According to the one or more embodiments of the inventive concept, optical devices may be disposed on an exterior side of the transparent display device, so that reflection of external light due to metal included in the transparent display device may be removed.

Also, according to the one or more embodiments of the inventive concept, the transparent display device and the transmittance adjusting device share the same substrate, so that transmittance of external light may be controlled using low power and the number of elements for the display device may be minimized. Accordingly, with respect to the display device, a weight, the number of manufacturing processes, material costs, and an error rate may be decreased.

While the inventive concept has been particularly shown and described with reference to exemplary embodiments thereof, it will be understood that various changes in form and details may be made therein without departing from the spirit and scope of the following claims.

What is claimed is:

1. A display apparatus capable of controlling light transmittance thereof, the display apparatus comprising:

a transparent display device including a first substrate having a first surface on which a pixel is positioned and a second surface opposite to the first surface, the pixel having a first region with an organic emission layer (organic EML) and a second region, the second region being adjacent to the first region and transmitting light;

a second substrate facing the first surface of the first substrate;

a first circular polarizer;

a second circular polarizer; and a transmittance adjusting device comprising the first substrate, a third substrate facing the second surface of the first substrate, and a liquid crystal layer between the second surface of the first substrate and a surface of the third substrate, the transmittance adjusting device for adjusting the light transmittance of the display apparatus, the light transmittance of the display apparatus being determined based on an amount of light incident from external to the display apparatus and passing through the second region of the pixel, wherein the transparent display device and the transmittance adjusting device are between the first and second circular polarizers, and share the first substrate as a single layer, and wherein the second region of the pixel does not overlap a semiconductor device.

2. The display apparatus of claim 1, wherein the liquid crystal layer corresponds to the second region of the transparent display device.

3. The display apparatus of claim 1, wherein liquid crystals in the liquid crystal layer are in a vertical alignment nematic (VAN) mode.

4. The display apparatus of claim 1, wherein the transmittance adjusting device comprises:

a first transparent electrode on the second surface of the first substrate;

a first alignment layer on the first transparent electrode;

a second transparent electrode on the surface of the third substrate; and a second alignment layer on the second transparent electrode.

5. The display apparatus of claim 1, wherein:

absorption axes of the first circular polarizer and the second circular polarizer are in a same direction, slow axes of the first circular polarizer and the second circular polarizer are in a same direction, and liquid crystals of the liquid crystal layer are aligned to be perpendicular to the second surface of the first substrate and a surface of the third substrate when an electric field is not applied thereto, and, when an electric field is applied thereto, the liquid crystals are horizontally aligned in a direction perpendicular to the slow axes.

6. The display apparatus of claim 1, wherein the second subtrate is a thin film encapsulation (TFE) member.

7. The display apparatus of claim 1, wherein a rotation direction of light incident through the first circular polarizer is opposite to a rotation direction of light incident through the second circular polarizer.

8. The display apparatus of claim 1, wherein:

the first circular polarizer includes a first linear polarizer on an exterior side of the second subtrate and a first retarder between the first linear polarizer and the second subtrate; and the second circular polarizer includes a second linear polarizer on an exterior side of the third subtrate and a second retarder between the second linear polarizer and the third substrate.

9. The display apparatus of claim 8, wherein:

absorption axes of the first linear polarizer and the second linear polarizer are in a same direction, slow axes of the first retarder and the second retarder are in a same direction, and liquid crystals of the liquid crystal layer are aligned to be perpendicular to the second surface of the first substrate and a surface of the third substrate when an electric field is not applied thereto, and, when an electric field is applied thereto, the liquid crystals are horizontally aligned in a direction perpendicular to the slow axes.

10. The display apparatus of claim 8, wherein absolute values of a first phase and a second phase are equal to each other, and rotation directions of the first phase and the second phase are different from each other.

11. The display apparatus of claim 1, wherein the liquid crystal layer of the transmittance adjusting device has a thickness capable of changing a phase of the light incident from the external by 90 degrees.

* * * * *